United States Patent
Solak

(10) Patent No.: US 8,617,775 B2
(45) Date of Patent: Dec. 31, 2013

(54) OPTIMIZED MASK DESIGN FOR FABRICATING PERIODIC AND QUASI-PERIODIC PATTERNS

(75) Inventor: Harun Solak, Brugg (CH)

(73) Assignee: Eulitha AG, Villigen (CH)

( * ) Notice: Subject to any disclaimer, the term of this patent is extended or adjusted under 35 U.S.C. 154(b) by 0 days.

(21) Appl. No.: 13/509,642

(22) PCT Filed: Sep. 14, 2010

(86) PCT No.: PCT/EP2010/063431
§ 371 (c)(1),
(2), (4) Date: Jul. 10, 2012

(87) PCT Pub. No.: WO2011/057835
PCT Pub. Date: May 19, 2011

(65) Prior Publication Data
US 2013/0095418 A1 Apr. 18, 2013

(30) Foreign Application Priority Data

Nov. 13, 2009 (EP) .................................... 09014217

(51) Int. Cl.
*G03F 7/20* (2006.01)
*G03F 1/00* (2012.01)
*G03F 1/26* (2012.01)

(52) U.S. Cl.
USPC ............ 430/30; 430/302; 430/325; 430/326; 430/396

(58) Field of Classification Search
USPC ............................ 430/30, 302, 325, 326, 396
See application file for complete search history.

(56) References Cited

FOREIGN PATENT DOCUMENTS

EP 1810085 B1 7/2007

OTHER PUBLICATIONS

Schellenberg F et al.—Optimization of real phase mask performance; Others;.
Socha R et al.—Contact hole reticle optimization by using interference mapping lithography (IML(TM)); Others;.
Su M F et al.—Fuzzy Learning of Talbot Effect Guides Optimal Mask Design for Proximity Field Nanopatterning Lithography; Others;.

*Primary Examiner* — Christopher Young
(74) *Attorney, Agent, or Firm* — Laurence A. Greenberg; Werner H. Stemer; Ralph E. Locher

(57) ABSTRACT

A method for printing a desired periodic or quasi-periodic pattern of dot features into a photosensitive layer disposed on a substrate including the steps of designing a mask pattern having a periodic or quasi-periodic array of unit cells each having a ring feature, forming a mask with said mask pattern, arranging the mask substantially parallel to the photosensitive layer, arranging the distance of the photosensitive layer from the mask and illuminating the mask according to one of the methods of achromatic Talbot lithography and displacement Talbot lithography, whereby the illumination transmitted by the mask exposes the photosensitive layer to an integrated intensity distribution that prints the desired pattern.

21 Claims, 10 Drawing Sheets

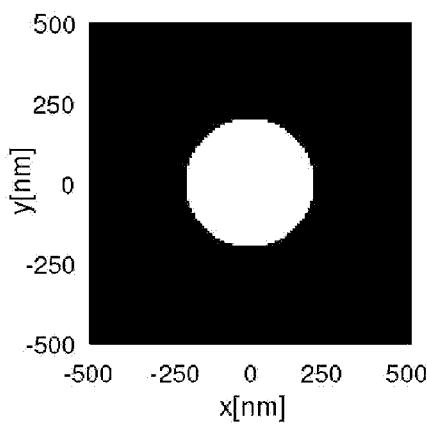
FIG. 2A (prior art)
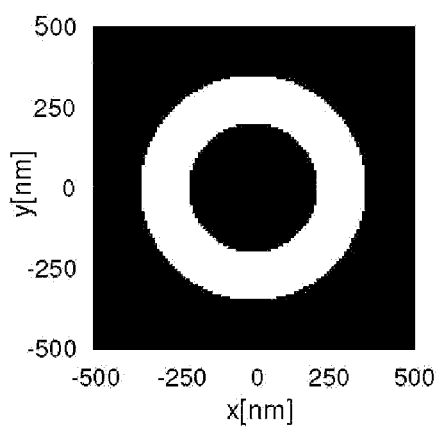 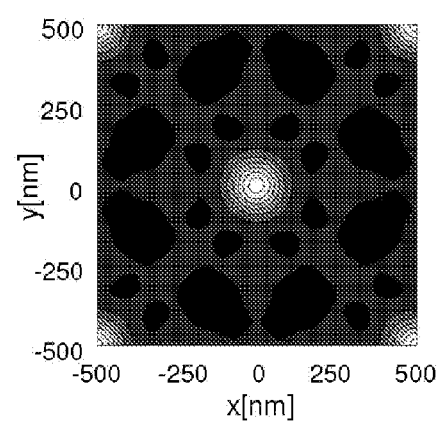
FIG. 2B          FIG. 2C
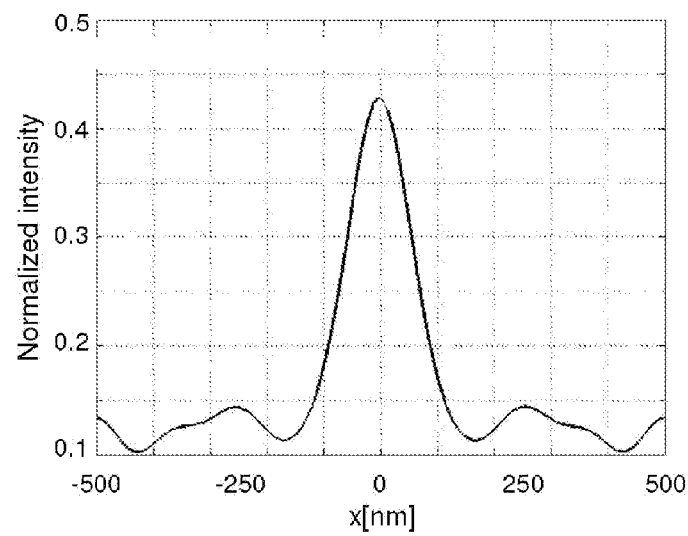
FIG. 2D

| Ring width (nm) | Central diameter (nm) | Peak intensity (normalized) | Peak width (FWHM) | Image contrast |
|---|---|---|---|---|
| 100* | 100* | 0.05 | 145 | 0.6 |
| 100 | 800 | 0.285 | 142 | 0.52 |
| 250 | 650 | 0.63 | 212 | 0.53 |
| 150 | 650 | 0.50 | 155 | 0.59 |
| 200 | 300 | 0.29 | 227 | 0.65 |

FIG. 4

| Ring width (nm) | Central diameter (nm) | Peak intensity (normalized) | Peak width (FWHM) | Image contrast |
|---|---|---|---|---|
| 100* | 100* | 0.12 | 153 | 0.7 |
| 150 | 750 | 1.16 | 145 | 0.67 |
| 200 | 700 | 1.28 | 162 | 0.64 |
| 150 | 450 | 0.78 | 171 | 0.72 |
| 150 | 250 | 0.41 | 243 | 0.77 |

FIG. 7

OPTIMIZED MASK DESIGN FOR FABRICATING PERIODIC AND QUASI-PERIODIC PATTERNS

The present invention relates to a method for printing a desired periodic or quasi-periodic pattern of dot features into a photosensitive layer formed on a substrate.

BACKGROUND OF THE INVENTION

Field of the Invention

Fabricating periodic patterns of high-resolution features on substrates is important for many applications. In particular, the formation of two-dimensional arrays of holes and posts with sub-micron dimensions is important for such applications as maximizing the brightness and efficiency of light-emitting diodes, light trapping for solar cells, photonic crystals and nanowire LED arrays, amongst others. Such structures may be fabricated using photolithographic techniques such as contact printing and projection printing. A particularly attractive photolithographic technique in the prior art for printing periodic patterns is based on the Talbot effect. Using this principle, a mask defining the periodic pattern is illuminated with a well-collimated beam of monochromatic light, and self-images of the pattern are formed in the transmitted light-field at certain distances, known as Talbot planes, from the mask. By placing a substrate coated with a photosensitive layer at one of these planes, the pattern in the mask is printed onto the substrate. This technique avoids damage to the mask that may be caused by contact printing, and avoids the complexity and cost of the imaging optics in high-resolution projection printers.

In a modification of this self-imaging technique, images with higher resolution than that of the pattern in the mask may be printed by placing the substrate at certain, intermediate distances between the Talbot planes. At these so-called fractional Talbot planes the period of the features in the image is smaller than that in the mask. This variant, which enables spatial-frequency multiplication or spatial-period division, functions better when the duty cycle of the mask features (i.e. the ratio of the width of the features to their period) is optimized to yield a high contrast of intensity distribution in the fractional Talbot planes.

In the prior art it is also known that the contrast of Talbot images can be enhanced by fabricating the periodic patterns in the mask out of phase shifting materials. A severe drawback of the Talbot technique, on the other hand, is that the intensity distribution in the image is very sensitive to the distance from the grating. Therefore, precise positioning and alignment of the substrate with respect to the mask is of critical importance. This "depth of field" limitation becomes much more restrictive as the period of the features in the mask is reduced. Moreover, this limitation renders the technique unsuitable for printing patterns on substrates that have topographical features which are larger than the depth of field.

In another, related method in the prior art, known as near-field holography, a mask with a periodic pattern is illuminated at a oblique angle by a collimated beam of ideally monochromatic light. In this method, the period of the pattern on the mask, the wavelength of the illumination and its angle of incidence on the mask are chosen so that only the zeroth-order (i.e. undiffracted) beam and a single first-order diffracted beam are present in the transmitted light. The interference of these two beams produces an image after the mask. Whilst the intensity distribution in the resulting image does not have a periodic dependence on the distance from the grating, its contrast degrades with increasing distance if the incident beam is not well collimated or accurately monochromatic. A drawback of this method is that the images formed using standard, chrome-on-glass masks have low contrast, and so requires the use of expensive phase masks to obtain high contrast. Furthermore, the intensity distribution of the image necessarily has sinusoidal form, so control over the duty cycle of the printed periodic pattern is very limited. Its applicability is also restricted by the limited range of periods that can printed using a given illumination wavelength. Moreover, the method can only be used for printing one-dimensional gratings structures, unless multiple exposures are employed.

Two other variants of Talbot lithography have recently been introduced for printing periodic patterns onto a substrate in a cost effective way. Both are described in European Patent Application EP 1 810 085 A1. In the first variant, known as achromatic Talbot lithography (ATL), the periodic pattern in the mask is a collimated beam of light with a significant spectral bandwidth instead of being monochromatic. This results in the photosensitive layer being exposed to an average, or integration, of the range of intensity distributions produced by the different wavelengths over the spectral bandwidth. The integrated intensity distribution has the advantageous property of being "stationary" beyond a certain distance from the mask, that is, it becomes invariant to further increase in distance. For a one-dimensional periodic pattern (i.e. a grating), the minimum distance, $d_{min}$, from the mask at which the stationary image is formed depends on the period of the pattern, p, and the spectral bandwidth of the illumination, $\Delta\lambda$, according to $$d_{min} \approx 2p^2/\Delta\lambda \qquad \text{equ. (1)}$$

For two-dimensional patterns, it is well-known in the prior art that the constant in the above expression is not necessarily 2 but depends on the array symmetry and on the periods of the pattern in the different directions. For example, for a two-dimensional pattern whose features are arranged on a square grid, the constant of 2 still applies.

The exact value of $d_{min}$ for the particular periodic pattern in the mask and the range of illuminating wavelengths may be determined by computer simulation of the propagation of the light-field transmitted by the pattern.

In the second variant described in European Patent Application EP 1 810 085 A1, which has been termed displacement Talbot lithography (DTL), the periodic pattern in the mask is illuminated with monochromatic light and, during exposure of a photosensitive layer on the substrate, the distance of the substrate from the mask is varied by at least the separation of successive Talbot planes. This results in the photosensitive layer being exposed to an average, or integration, of the range of intensity distributions formed between successive Talbot planes. The integrated intensity distribution similarly has the advantageous property of being largely independent of the absolute separation of the substrate and mask. In fact, the ATL and DTL techniques are essentially equivalent in that both produce an averaging, or integration, at the substrate of the same range of intensity distributions: with ATL the range of intensity distributions is generated by the range of wavelengths, and with DTL it is generated by the range of distances of the substrate from the mask. The patterns printed onto the substrate in both cases have a large depth of focus, and so overcome the depth-of-field limitations of Talbot images and sub-images produced using the classical Talbot effect.

With both the ATL and DTL methods, the light-fields exposing the substrate are formed by diffraction of the incident illumination by the mask and by the subsequent interference of the propagating diffracted orders. Although the period of the printed pattern is related to the period of the pattern in the mask, it is not necessarily the same but may be, for example, frequency multiplied. The methods may be applied to printing one-dimensional periodic patterns composed of lines and spaces, or to two-dimensional patterns of, for example, dots arranged on a regular square, rectangular or hexagonal grid for fabricating corresponding arrays of holes or posts on a substrate. The ATL and DTL methods may additionally be applied to patterns whose period is not uniform over the pattern area but varies slowly across the pattern, that is to patterns that are quasi-periodic. For example, the methods can be applied to patterns whose features follow curved paths such as a circular grating or an array of holes on concentric circular tracks, to linear gratings that have a frequency chirp along the grating, or to two-dimensional periodic patterns of features, such as holes or posts, that have a frequency chirp in one or two directions.

In the prior art teachings of ATL and DTL mentioned above, the shape and duty cycle of the features printed onto the substrates are similar or the same as the shape and duty cycle of the features in the mask. For example, in order to print a two-dimensional array of circular or near-circular dots with a dimension that is small in relation to the array period, the prior art teaches that the mask should similarly contain an array of circular or near-circular holes with a dimension that is small in relation to the hole period. Since square holes in the mask produce near-circular features in the printed pattern when exposing with the ATL or DTL techniques, and the manufacturability of the mask using electron lithography is considerably facilitated and its cost considerably reduced if the sub-micron pattern features are square rather than circular, it is advantageous if the mask can be designed with square rings. For printing one-dimensional patterns such as a grating comprising an array of lines with a linewidth that is small in relation to the line period, the prior art similarly teaches that the pattern in the mask should comprise an array of lines whose linewidth is small in relation to the line period. The prior art on ATL and DTL further teaches that the features in the mask may have the opposite polarity to that of the features in the printed pattern. For example, if the desired printed pattern is an array of dots then, instead of using a mask comprising an array of holes in a chrome layer, a mask may be used in which each unit cell of the periodic pattern is transparent except for a chrome dot (i.e. is light-field rather than dark-field, using mask design terminology).

A significant drawback of the ATL and DTL techniques taught in the prior art is that for certain patterns it is difficult or even impossible to obtain an integrated intensity distribution at the substrate that is suitable for a reliable lithographic process. For a process to be useful and cost-effective for device manufacturing it is most desirable that the individual intensity peaks in the integrated intensity distribution have a high intensity, a high contrast, a high intensity gradient at the edge of the peaks, have the required cross-sectional shape, and furthermore that the period of the printed pattern is reduced by the desired factor in relation to the period of the features in the mask. In the above-mentioned example in which the size of the holes in the mask is small in relation to the period, only a very small percentage of the light incident on the mask forms the intensity peaks in the integrated intensity distribution, and so a long exposure time is required to print the pattern of dots into the photoresist layer for forming the pattern of holes or posts, which is undesirable for a production process.

BRIEF SUMMARY OF THE INVENTION

It is therefore a first objective of the present invention to provide a lithographic method based on the ATL and DTL techniques that enables a periodic pattern of dot features to be printed into a photosensitive layer formed on a substrate, and so that the integrated intensity distribution exposing the layer has the properties required for a reliable lithographic process.

It is a particular object of this first objective that said properties include any of the magnitude of the intensity peaks in the integrated intensity distribution that print the dot features, the full-width of the intensity peaks at half their maximum value, the contrast of the intensity peaks, the intensity-gradient at edges of the peaks, and the period of the mask pattern with respect to that of the printed pattern, that is, the spatial-frequency multiplication factor.

It is a second objective of the present invention to provide a method for designing a pattern of periodic features in a mask that may be employed with the ATL or DTL techniques to print a periodic pattern of dot features into a photosensitive layer formed on a substrate whereby the integrated intensity distribution exposing the layer has the properties required for a production lithographic process.

It is a particular object of this second objective that said properties in this further objective include any of the magnitude of the intensity peaks in the integrated intensity distribution that print the dot features, the full-width of the intensity peaks at half their maximum value, the contrast of the intensity peaks, the intensity-gradient at edges of the peaks, and the period of the mask pattern with respect to that of the printed pattern, that is, the spatial-frequency multiplication factor.

It is particularly intended that the printed periodic pattern of dot features be employed to form a periodic pattern of holes in the photosensitive layer or, alternatively, a periodic pattern of pillars in the layer. The shape of the dot features and the resulting holes or posts is preferably circular, though may alternatively be, to some extent, elliptical, square, rectangular or triangular.

It is a further object that the method be applicable to printing periodic patterns of dot features that are arranged on any of a square, rectangular or hexagonal grid, and additionally that it be applicable to such patterns having a range of duty cycles, where the duty cycle is the ratio of the dot size to the dot period.

According to a first aspect of the present invention, a method is provided for printing a desired periodic or quasi-periodic pattern of dot features into a photosensitive layer formed on a substrate including the steps of:

a) designing a mask pattern with a periodic or quasi-periodic array of unit cells each having a ring feature;

b) forming a mask with said mask pattern;

c) arranging the mask substantially parallel to the photosensitive layer; and d) arranging the distance of the photosensitive layer from the mask and illuminating the mask according to one of the methods of achromatic Talbot lithography and displacement Talbot lithography, whereby the illumination transmitted by the mask exposes the photosensitive layer to an integrated intensity distribution that prints the desired pattern.

Preferably, the mask pattern is designed by defining the ring feature by a set of parameters, attributing a first set of values to said set of parameters, calculating a first integrated intensity distribution that would expose the photosensitive layer using a mask pattern defined by said first set of attributed values and one of the methods of achromatic Talbot lithography and displacement Talbot lithography, and evaluating said first integrated intensity distribution to obtain a first result for at least one figure of merit, repeating the attributing and calculating steps with at least one further set of values for the set of parameters and evaluating at least one further integrated intensity distribution to obtain at least one further result for said at least one figure of merit, and determining from the plurality of results thereby obtained the optimum set of attributed values for the set of parameters.

The set of parameters defining the ring feature may comprise the inner and outer dimensions of the ring or, equivalently, the width, or thickness, of the ring and its mean diameter. Preferably, the integrated intensity distribution is calculated using an electromagnetic method such as finite difference time domain or rigorous coupled wave analysis.

Advantageously, the inner and outer edges of the ring feature are circular or square. They may also be hexagons, octagons, or other regular or irregular polygons. The inner and outer edges of the ring feature are not necessarily the same shape.

The unit cell of the mask pattern may further include at least one additional ring feature that is concentric with the ring feature, or may include a filled area that is concentric with the ring feature.

Preferably, the figure, or figures, of merit of the integrated intensity distribution is one of, or a combination of, the following: the magnitude of intensity peaks in the integrated distribution that print the dot features, the full-width of the intensity peaks at half their maximum value, the contrast of the intensity peaks, the gradient of intensity at the edges of the peaks, the factor relating the period of the mask pattern to that of the printed pattern, and the cross-sectional shape of the intensity peaks.

The array of the mask pattern may have any of a square, rectangular or hexagonal grid.

Preferably, the ring features in the mask pattern comprise transparent regions in an otherwise opaque area.

Advantageously, the ring features in the mask pattern are formed using at least one of partially opaque material and a phase shifting material.

The quasi-periodic pattern of desired features has a period or a duty cycle that varies across the pattern.

The photosensitive layer may comprise a layer of a positive-tone photoresist in which case a pattern of holes is formed following the development of the photoresist or, alternatively, it may comprise a layer of a negative-tone photoresist, in which case an array of posts, or pillars, is formed after the photoresist development.

In the case that achromatic Talbot lithography is employed to print the pattern using illumination with a significant bandwidth, then the distance of the photosensitive layer from the mask should be arranged during illumination of the mask and photosensitive layer so that the intensity distribution exposing the layer integrated over the spectral bandwidth of the illumination forms a stationary image.

In the case that displacement Talbot lithography is employed to print the pattern using substantially monochromatic illumination, then the distance of the photosensitive layer from the mask should be varied during illumination of the mask and photosensitive layer by at least the separation of successive Talbot planes so that the intensity distribution exposing the photosensitive layer integrated over the variation of the distance prints the desired pattern.

Whereas, the medium between the photosensitive layer and the mask may be air with a refractive index of ~1, a fluid with a higher refractive index may instead be arranged between the layer and the mask in order that periodic and quasi-periodic patterns with smaller periods or features may be printed using illumination at a particular wavelength or with a particular range of wavelengths.

The photosensitive layer may be formed directly on the surface of the substrate or may be formed indirectly with one or more intermediate layers of other materials between it and the substrate surface. The intermediate layer or layers are not necessarily uniform layers but may be structured or patterned.

BRIEF DESCRIPTION OF THE SEVERAL VIEWS OF THE DRAWING

Preferred examples of the present invention are hereinafter described with reference to the following figures:

FIG. 2 illustrates a first embodiment of the present invention, for printing an array of dots on a square grid, in which FIG. 2a shows a unit cell of a periodic pattern in a mask according to the prior art; FIG. 2b shows a unit cell of a periodic pattern in the mask with a circular ring feature; FIG. 2c shows a computer simulation of a unit cell of the resulting intensity distribution at the substrate formed using ATL or DTL; and FIG. 2d shows the intensity variation across the peak in the intensity distribution.

FIG. 3 shows dependencies of properties of the intensity distribution at the substrate on the width and mean diameter of the ring design, in which

FIG. 4 shows a table of selected values from FIG. 3.

FIG. 5 illustrates a second embodiment of the invention, for printing an array of dots on a hexagonal grid, in which

FIG. 6 shows dependencies of properties of the intensity distribution at the substrate on the width and mean diameter of the ring design, in which

FIG. 7 shows a table of selected values from FIG. 6.

FIG. 8 illustrates a third embodiment of the invention, for printing an array of dots on a square grid, in which

FIG. 9 illustrates a fourth embodiment of the invention, for printing an array of dots on a square grid, in which

DESCRIPTION OF THE INVENTION

Figure 1:
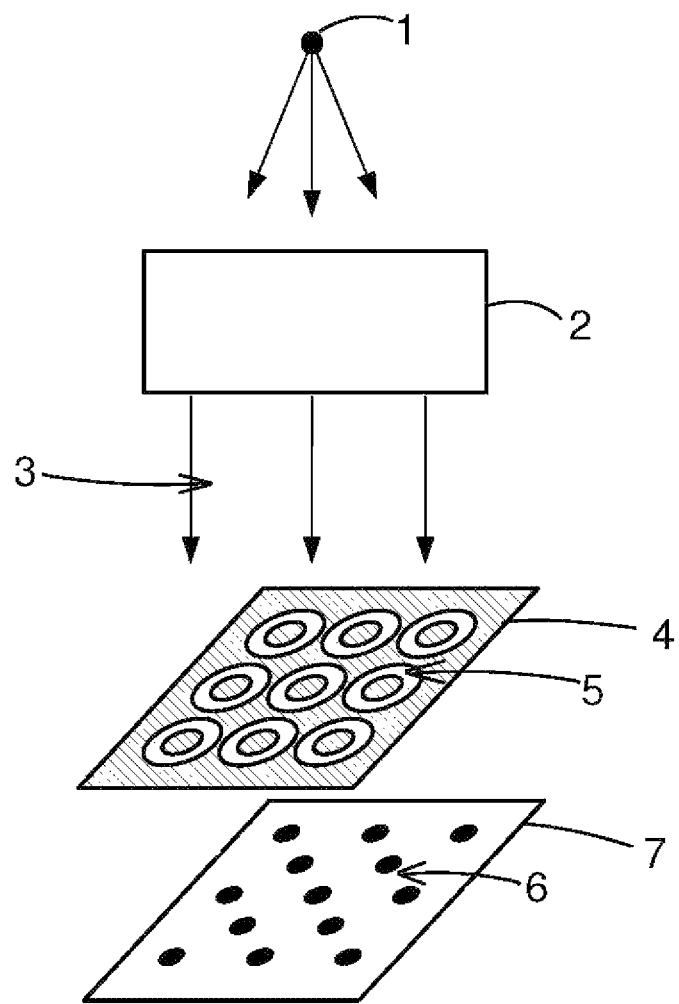
FIG. 1 is a schematic diagram illustrating the general principle of the present invention.

The general principle of the present invention for printing a desired periodic or quasi-periodic pattern of dot features into a photosensitive layer formed on a substrate is schematically illustrated in FIG. 1. Light from an illumination source 1 is incident on illumination optics 2 that forms a beam of substantially collimated light for illuminating a pattern 5 in a mask 4. The pattern 5 in the mask 4 comprises a two-dimensional periodic array of ring features that repeat, in this example, on a square grid. Below the mask 4 is a substrate 7 with a photosensitive layer on its upper surface. Exposure of the mask is performed using either of the techniques of achromatic Talbot lithography and displacement Talbot lithography. In the case of achromatic Talbot lithography, the illumination source 1 is selected so that the light illuminating the mask has a significant spectral bandwidth, such as a light emitting diode or a discharge lamp, and the separation between the substrate 7 and mask 4 during exposure is arranged, in accordance with this technique, to be larger than the minimum value required for a stationary image to be formed at the surface of the substrate 7. In the case of displacement Talbot lithography, the light source 1 is selected so that the light illuminating the mask is instead substantially monochromatic, so is preferably a laser, and the distance of the substrate 7 from the mask 4 is varied during exposure, in accordance with that technique, by at least the separation of successive Talbot planes. Using either of these techniques and appropriate design of the ring features enables the formation of an integrated intensity distribution at the substrate surface for printing a periodic pattern of dot features that has the properties required for a reliable lithographic process. The properties concerned may be any of the peak intensity of the dot features, the full-width of the intensity peaks at half their maximum intensity, the contrast of the intensity peaks, the gradient of intensity at the edges of the peaks, the factor relating the period of the mask pattern to that of the printed pattern, and the cross-sectional shape of the intensity peaks.

The selection of ring features for the mask pattern opens up a design space for satisfying the requirements of a reliable lithographic process for printing an array of dots, which is not available using the mask feature designs taught in the prior art. The ring design is preferably optimized using computer simulation to calculate the light-field transmitted by a periodic pattern of rings in the mask when illuminated according to one of the ATL or DTL techniques and hence determine the resulting integrated intensity distribution at the substrate. The simulations should be based on the theoretical principles of ATL and DTL that are well described in the prior art, and may be performed, as also shown in the prior art, using such standard electromagnetic calculation methods as finite difference time domain (FDTD), rigorous coupled wave analysis (RCWA) and angular-spectrum propagation method, all of which are well-known to those skilled in the theoretical modeling of the interaction of light with periodic microstructures. Commercially available software such as GSolver (produced by Grating Solver Development Co.), in the case of RWCA, or freeware programs such as MEEP (produced by MIT), in the case of FDTD, may be employed.

A number of examples of the design optimizations that may be performed in different embodiments of the present invention are now described.

As previously stated, an important application of the invention is the formation of a two-dimensional periodic pattern of holes, or posts, on a square grid in a layer photoresist on a substrate. Holes may be formed in photoresist by exposing a layer of positive-tone photoresist to a periodic pattern of dot features, or intensity peaks, generated by either of the ATL or DTL methods so that the integrated intensity distribution exposing the photoresist has a large depth of focus; or, conversely, posts may be formed by exposing a negative-tone photoresist to a periodic pattern of dot features, or intensity peaks, generated in the same way. The diameter of the printed holes is generally an important parameter that needs to be accurately controlled in a reliable lithographic process. In the prior art teaching on conventional Talbot lithography, achromatic Talbot lithography and displacement Talbot lithography, arrays of holes are printed using mask patterns comprising similar arrays of holes in an opaque layer (or in a phase-shifting, partially transparent layer). A typical unit cell of such a periodic pattern is shown in FIG. 2a), in which the array has a square grid with a period of 1 µm in both x and y directions and the diameter of the transparent hole in the otherwise opaque cell is 400 nm. The size of the resulting hole printed in the photoresist using such a mask may be adjusted by changing the diameter of the holes in the mask. However, if smaller holes are required, then reducing the hole size in the mask also reduces the proportion of the incident light that forms the integrated intensity distribution at the photoresist, which if ATL or DTL is being used is most disadvantageous with respect to the maximum intensity of the peaks.

In a first embodiment of the present invention for printing a desired periodic pattern of dots in a photosensitive layer the mask design is composed of a periodic pattern of transparent annular regions, that is rings, arranged on a square grid in an otherwise opaque layer. This is illustrated in FIG. 2b which shows a unit cell of such an array whose period in both x and y directions is 1 µm. The design parameters of a ring may be defined as the inner and outer diameters of the transparent region or, equivalently, as the width of the transparent region of the ring and the mean of the inner and outer diameters. The integrated intensity distribution produced at the photoresist using a periodic array of such rings with either the ATL or DTL techniques is preferably determined by computer simulation using, for instance, standard FDTD or RWCA modeling software. In the case of achromatic Talbot lithography, it may be performed by first calculating the diffracted light-field formed after the mask by each of the illumination wavelengths over the spectral bandwidth of the illumination source, and then integrating the resultant light-fields at the distance of the substrate to determine the average intensity distribution exposing the photoresist. In the case of displacement Talbot lithography, it may be performed by first calculating the diffracted light-field after the mask for the particular wavelength of the monochromatic source and then integrating the light-field at the substrate as the distance of the substrate from the mask is varied during the exposure, to determine the average intensity distribution exposing the photoresist.

Computer simulation of the light-field generated at the photoresist by exposing, using the ATL technique, a square-grid array of ring features with the unit cell represented in FIG. 2b produced a square-grid array of intensity peaks with the unit cell shown in FIG. 2c. With respect to the mask and illumination parameters employed in the simulation, the mask pattern was defined as holes in a 60 nm-thick layer of chrome on a transparent fused silica substrate, and the illumination was a collimated beam of un-polarized, deep-ultraviolet (DUV) light with a central wavelength of 240 nm. The spectral bandwidth of the illumination and the distance of the photosensitive layer from the mask were selected according to the prior art teaching of ATL for the case of a two-dimensional periodic pattern with features arranged on a square-grid. A suitable illumination source for performing achromatic Talbot lithography at this wavelength is a mercury-xenon lamp. Since the emission from such a lamp has a very broad spectrum, its output should be spectrally filtered, preferably using a standard component such as a dichroic mirror, in order to obtain the required DUV component, and should also be collimated, preferably using standard components such as a lens or lenses, so that the rays of DUV light illuminating the mask are substantially parallel. For the simulation the refractive index of the photoresist was assumed to be 1.52, and water was included as an immersion liquid between the mask and the photoresist.

As is apparent from FIGS. 2b and 2c, the axes of the printed pattern are rotated by 45° with respect those of the pattern in the mask, and the period of the printed pattern is reduced by a factor of √2 with respect to that of the pattern in the mask, that is, the period of the printed pattern is 0.71 μm. Both of these transformations may, if necessary, be compensated in the mask design. The intensity variation across the distribution of FIG. 2c is depicted in FIG. 2d, which clearly shows that high-contrast intensity peaks may be obtained using a square-grid array of ring features in the mask.

The dependencies of the integrated intensity distribution exposing the photoresist on the different parameters of the ring design may be determined by performing multiple computer simulations using different sets of parameter values. The resulting distributions can then be analyzed with respect to certain image properties, or figures of merit, that are important for ensuring an effective lithographic process.

Figure 3A:
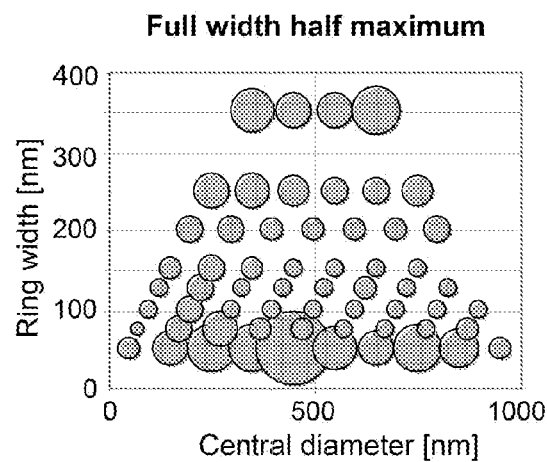
FIG. 3a shows the dependence of the full width half maximum of the intensity peak.
Figure 3B:
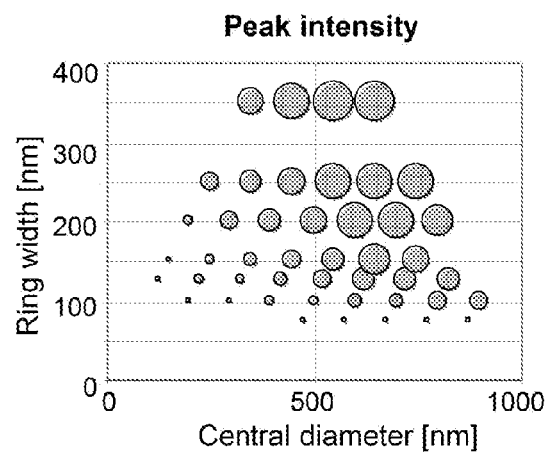
FIG. 3b shows the dependence of the peak intensity.
Figure 3C:
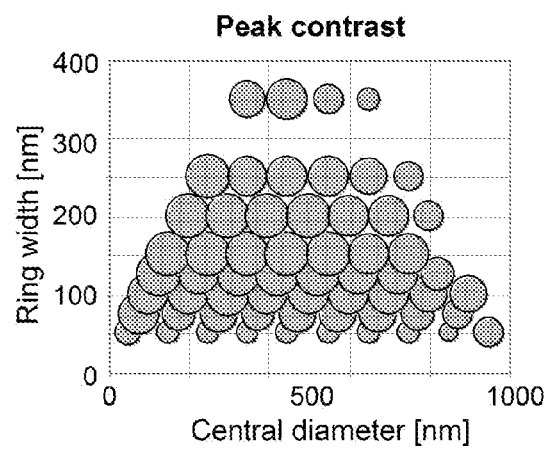
FIG. 3c shows the dependence of the intensity modulation of intensity distribution.

The results of such an analysis undertaken for three properties of the resulting intensity distributions are shown in FIG. 3. FIG. 3a illustrates the dependencies of the full width at half maximum (FWHM) of the peak intensities on the width and mean diameter of the ring design. The size of each spot in the diagram is proportional to the value of the FWHM. FIG. 3b similarly illustrates the dependencies of the peak intensity, which is normalized with respect to the intensity illuminating the mask, on the same two design parameters; and FIG. 3c illustrates the dependencies of the contrast of the intensity peaks, which is defined here as the peak intensity divided by the background intensity, on the two parameters. The FWHM, peak intensity and contrast are all important properties of the intensity distribution for ensuring an effective lithographic fabrication process.

The values of selected data from FIG. 3 are shown in the table in FIG. 4.

The significant advantages of using ring features over holes are apparent for those skilled in the art from studying the results shown in FIG. 3. For example, if the goal is to obtain the minimum hole size in the photoresist whilst maximizing both the image intensity and contrast, then the selection of parameter values of 150 nm and 650 nm for the ring-width and mean diameter respectively would produce the desired result. The intensity peak would have a maximum value of 0.5, a FWHM diameter of 155 nm and an image contrast of 0.59. To obtain the same diameter of printed holes using a mask with circular holes would require, according to the data in the same figure, a hole diameter of 200 nm (equivalent to a ring with a width of 100 nm and a mean diameter of 100 nm). As is also illustrated in FIG. 3, a mask with such holes would produce intensity peaks with a maximum value of 0.06, a diameter of 145 nm and an image contrast of 0.6.

This first embodiment demonstrates that a mask pattern comprising an array of ring features may be employed with the ATL exposure technique to print a square-grid array of intensity peaks that have ~8 times the intensity of those produced using a mask designed according to the prior art teaching of ATL. This enables a pattern of holes on a square grid to be printed with a large depth of focus and substantially higher throughput, and may be used to relax the specifications of the lithography tool or the photoresist.

Results that are similar to those illustrated in FIGS. 2 and 3 may be obtained by computer simulations of the integrated intensity distributions generated at a photosensitive layer by exposing the same periodic patterns of ring features using instead displacement Talbot lithography. In this case a suitable monochromatic light source that has a wavelength close to that employed in the ATL simulations is a krypton fluoride excimer laser whose emission wavelength is 248 nm. The output beam from such a source should be expanded and collimated using standard optical components so that the rays of DUV light illuminating the pattern in the mask are substantially parallel. During the exposure, the separation of the photoresist-coated substrate and the mask should be varied according to the prior art teaching of DTL so that the required integrated intensity distribution is printed into the photoresist. For a hexagonal pattern with a nearest-neighbor period of 1 μm, and an exposure wavelength of 248 nm, it is determined using the prior art that the separation of Talbot planes is ~6 μm (the exact value may be calculated by standard computer simulation of the light-field transmitted by the mask); hence, to expose the photoresist to the required integrated intensity distribution, the separation of the photoresist-coated substrate and the mask should be varied by at least ±3 μm during the exposure. Such a variation may be achieved using an appropriately configured high-resolution actuator, such as a piezo-electric transducer, to longitudinally displace the substrate relative to the mask during the exposure.

Figure 5A:
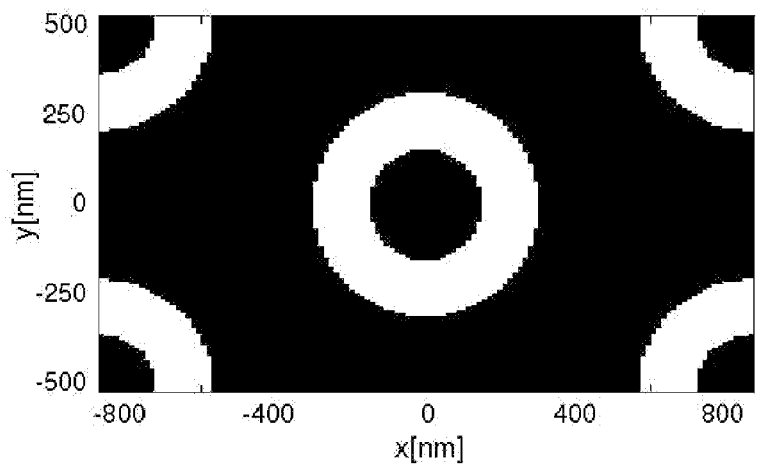
FIG. 5a shows a unit cell of a periodic pattern in a mask with a circular ring feature.
Figure 5B:
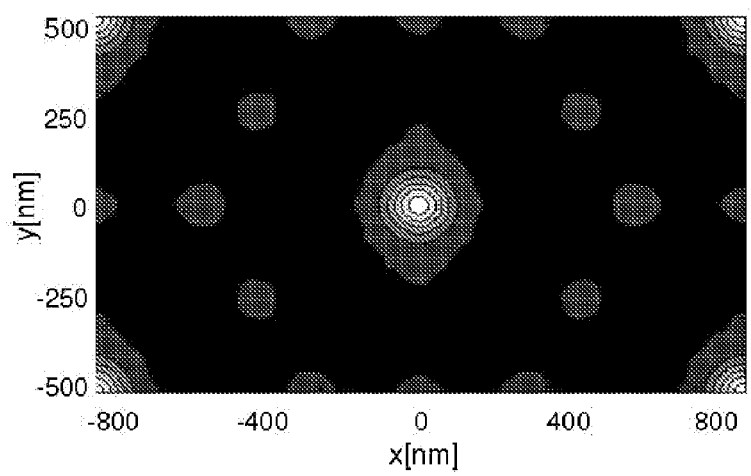
FIG. 5b shows a computer simulation of a unit cell of the resulting intensity distribution at the substrate formed using ATL or DTL.

Another application of the present invention is the formation of an array of holes, or posts, on a hexagonal grid, instead of a square grid, in a layer of photoresist on a substrate. The prior art teaches that a mask containing a hexagonal array of holes should be used. According to a second embodiment of the present invention, the mask pattern employed is rather a hexagonal array of annular transparent regions, or rings, in an opaque layer. A unit cell of such an array is represented in FIG. 5a, the period of the unit cell in x and y directions being ~1.73 μm and 1 μm respectively, so that the period of the rings in the directions of the nearest neighbors is 1 μm. Computer simulation of a unit cell of the light-field generated at the photosensitive layer by exposing this array, with the same ATL exposure arrangement as in the first embodiment, yields the intensity distribution shown in FIG. 5b. This result similarly demonstrates that a periodic pattern of ring features in the mask may be employed with the ATL technique to print a hexagonal array of holes into a photosensitive layer. Unlike for the square-grid array of the first embodiment, the period of the peaks in the resulting intensity distribution and the orientations of the axes of the printed pattern are the same as those of the hexagonal array in the mask. Similar results may be obtained with the same mask using the DTL technique.

Figure 6A:
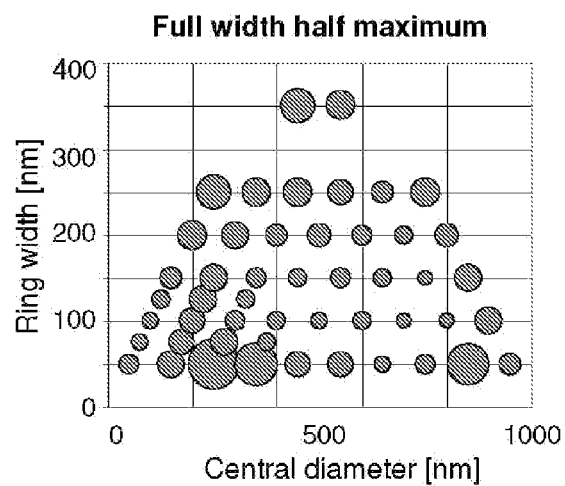
FIG. 6a shows the dependence of the full width half maximum of the intensity peak.
Figure 6B:
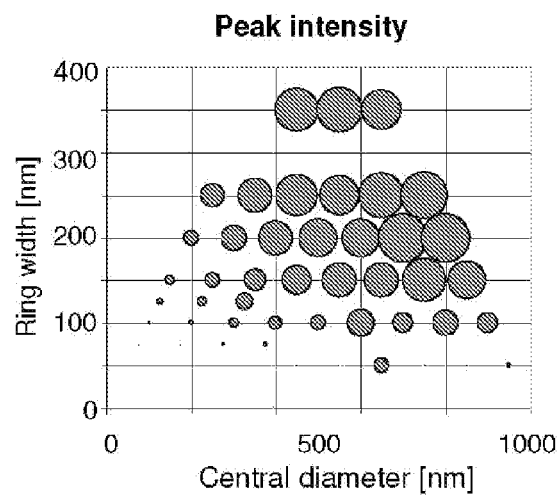
FIG. 6b shows the dependence of the peak intensity.
Figure 6C:
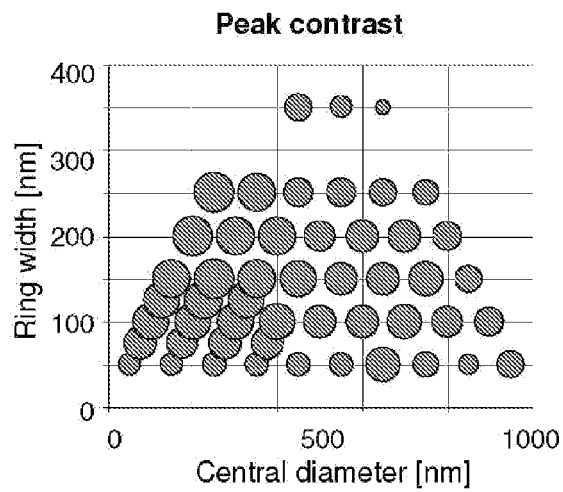
FIG. 6c shows the dependence of the intensity modulation of intensity distribution.

As for the first embodiment, the dependencies of the intensity distribution at the substrate on the parameters of the ring design may be determined by performing multiple computer simulations using different sets of values for the parameters. The results of such an analysis undertaken for the same three properties of the intensity distributions are shown in FIG. 6. FIG. 6a illustrates the dependencies of the full width at half maximum (FWHM) of the intensity peak on the width and mean diameter of the ring design. The area of each spot in the diagram is proportional to the value of the FWHM. FIG. 6b similarly illustrates the dependencies of the peak intensity value, which is normalized with respect to the intensity illuminating the mask, on the same design parameters; and FIG. 6c illustrates the dependencies of the contrast of the intensity peaks, which is defined here as the peak intensity divided by the background intensity, on the two parameters.

The values of selected data from FIG. 6 are shown in the table in FIG. 7.

The significant advantages of using a hexagonal array of ring features in the mask design instead of holes are apparent for those skilled in the art from studying the results shown in FIG. 6. For example, if the goal is to obtain the minimum hole size in the photoresist whilst maximizing both the image intensity and contrast, then the selection of parameter values of 200 nm and 700 nm for the ring-width and mean diameter respectively would produce the desired result. The resulting intensity peak would have a FWHM diameter of 162 nm, a peak intensity of 1.28 and an image contrast of 0.64. To obtain the same diameter of printed holes using a mask with circular holes would require, according to the data in the same figure, a hole diameter of 200 nm. As also indicated in FIG. 6, a mask with such holes would produce intensity peaks with a FWHM diameter 153 nm, a peak intensity of 0.12 and an image contrast of 0.7. This mask is again preferably manufactured using electron-beam lithography and employed according to the prior art teachings of achromatic and displacement Talbot lithography in order to print the desired pattern of dots into photosensitive layer on a substrate.

This embodiment demonstrates that a mask pattern comprising an array of ring features enables the generation, using ATL or DTL, of a hexagonal-grid array of intensity peaks that have ~11 times the intensity of those produced using a mask designed according to the prior art on ATL and DTL. This enables a periodic pattern of holes on a hexagonal-grid to be printed with a large depth of focus and substantially higher throughput, and may be used to relax the requirements of the lithography tool or the photoresist.

Figure 5C:
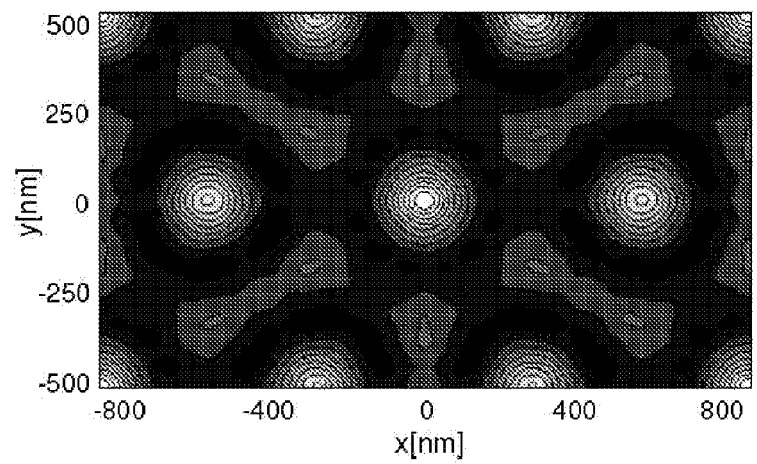
FIG. 5c shows a computer simulation of a unit cell of the intensity distribution at the substrate formed with different values for the ring design parameters.

By performing a different optimization of the parameters of the ring design illustrated in FIG. 5a, it is possible to generate a hexagonal array of intensity peaks with a higher spatial frequency than that in the mask. With reference to FIG. 5c, a ring width and a mean diameter of 350 nm and 650 nm respectively produces a hexagonal array of intensity peaks whose period is reduced by a factor of $\sqrt{3}$ with respect to that of the rings in the mask. The density of the peaks is therefore increased by a factor of 3 with respect to that of the rings in the mask, which is advantageous for certain applications.

This embodiment therefore additionally demonstrates the capability of the present invention for reducing the period of the printed periodic pattern of holes with respect to that of the pattern in the mask.

Figure 8A:
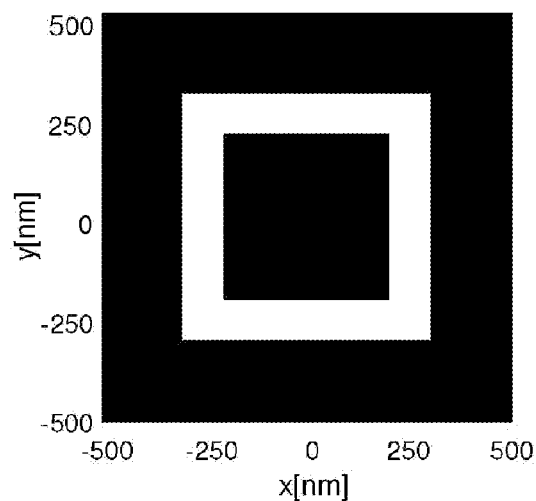
FIG. 8a shows a unit cell of a periodic pattern in a mask with a square ring feature.
Figure 8B:
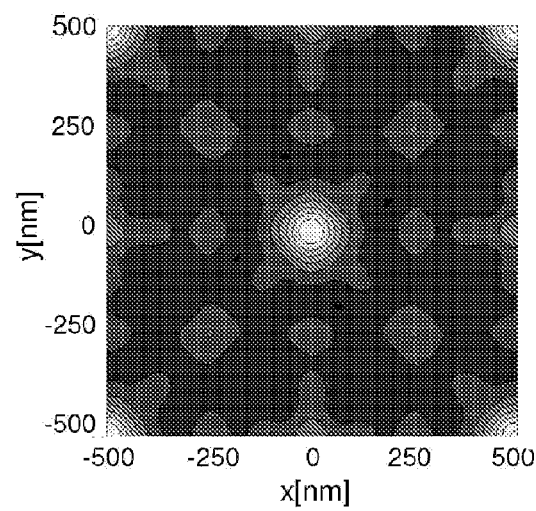
FIG. 8b shows a computer simulation of a unit cell of the resulting intensity distribution at the substrate formed using ATL or DTL.
Figure 8C:
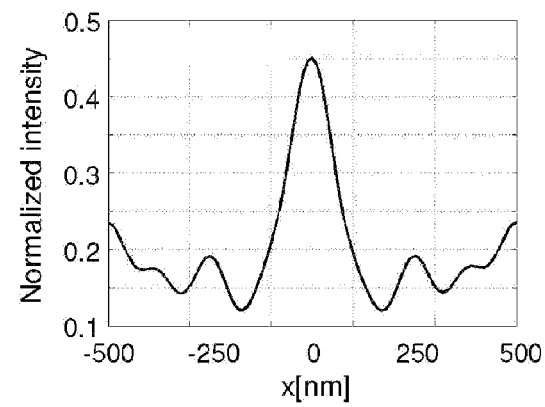
FIG. 8c shows the intensity variation across the peak in the intensity distribution.

In a third embodiment of the invention, a periodic pattern of dots with properties suitable for a lithographic process may also be printed using a mask with a periodic pattern of rings whose shape is not circular but square. Masks with square rings have the advantage that they are more easy and less costly to fabricate using electron-beam lithography than masks with circular rings. With reference to FIG. 8a, which shows an example of a unit cell in such a design, the ring feature is defined by inner and outer boundaries having square shapes. The design shown in the figure has been partially optimized using the procedure described in the earlier embodiments, and a computer simulation of a unit cell of the resulting integrated intensity distribution formed at the photosensitive layer, using the same ATL exposure arrangement as the earlier embodiments, is shown in FIG. 8b. The variation of intensity across the center of this distribution illustrated in FIG. 8b is shown in FIG. 8c. As can be seen from these figures, the resulting intensity distribution is similar to that generated in the first embodiment using a mask with the circular ring features, except that the intensity peaks have a slightly rhomboid shape. This distribution though would also be very suitable for an effective lithographic process for forming arrays of holes or posts in or on the surface of a substrate. As for the earlier embodiments, similar results may be obtained using the same mask with the DTL technique.

Figure 9A:
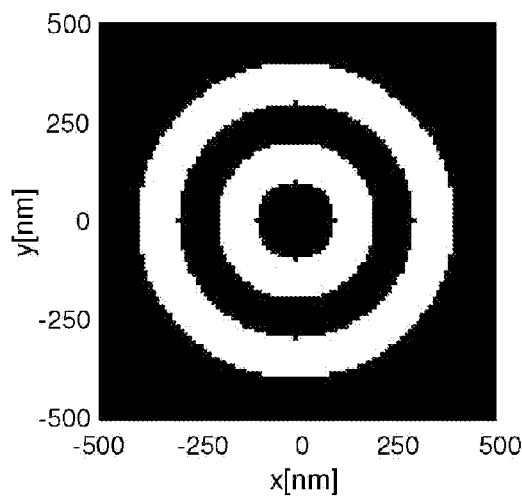
FIG. 9a shows a unit cell of a periodic pattern in a mask with a pair of concentric circular ring features.
Figure 9B:
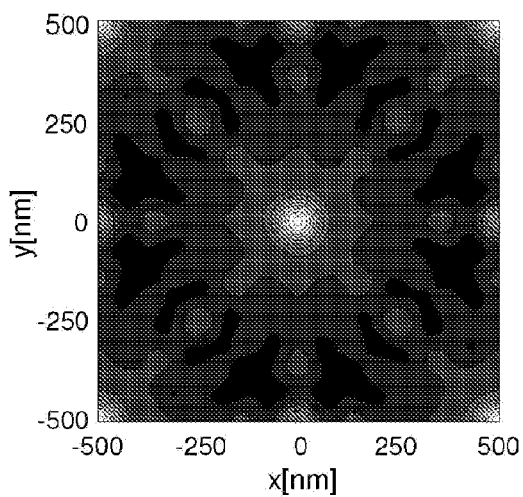
FIG. 9b shows a computer simulation of a unit cell of the resulting intensity distribution at the substrate formed using ATL or DTL.
Figure 9C:
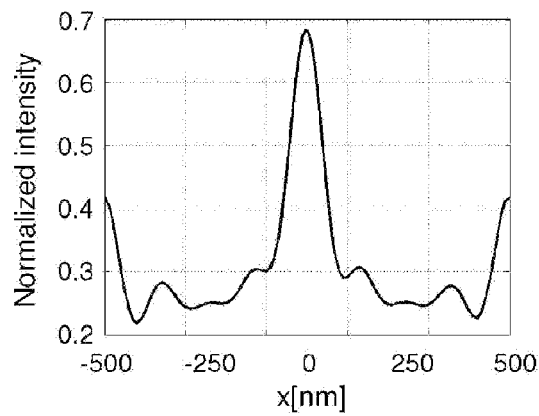
FIG. 9c shows the intensity variation across the peak in the intensity distribution.

In a fourth embodiment of the invention, a periodic pattern of dots with properties suitable for a lithographic process may also be obtained using a mask having a periodic pattern whose unit cell contains not just a single circular ring, but rather a pair of circular rings that are concentric. With reference to FIG. 9a, which shows an example of such a design, the two ring features have the same width, or thickness, and the region between them has a width that is also equal to the ring width. The design shown in the figure has been partially optimized using the procedure described in earlier embodiments and a computer simulation of a unit cell of the resulting integrated intensity distribution formed at the photosensitive layer, using the same ATL exposure arrangement as the earlier embodiments, is shown in FIG. 9b, and the variation of intensity across the center of this distribution is shown in FIG. 9c. As can be seen from these figures, the resulting intensity distribution is similar to that generated using a mask with the circular ring features of the first embodiment, except that secondary intensity peaks visible at the centers of the edges of the unit cell, and at the extremes of the intensity profile in FIG. 9c, are more significant than in the first embodiment. The magnitude of these secondary peaks may be reduced by further optimization of the parameters of the double-ring design, in particular the thickness of the two rings and the width of the space between them are not constrained to be the same value but may take different values. The intensity distribution shown in FIGS. 9b and 9c may though be suitable for providing an effective lithographic process for certain applications, and so the ring design of FIG. 9a may be directly implemented in a mask. As for the earlier embodiments, similar results may be obtained using the same mask with the DTL technique.

Of course, it should be understood that in other embodiments of the invention, triple-ring or other multiple-ring designs may be employed in the mask for generating periodic patterns of dots using either the DTL or ATL methods; and the shape of the rings are not constrained to be circular but may have other shapes, for instance, be square.

Figure 10:
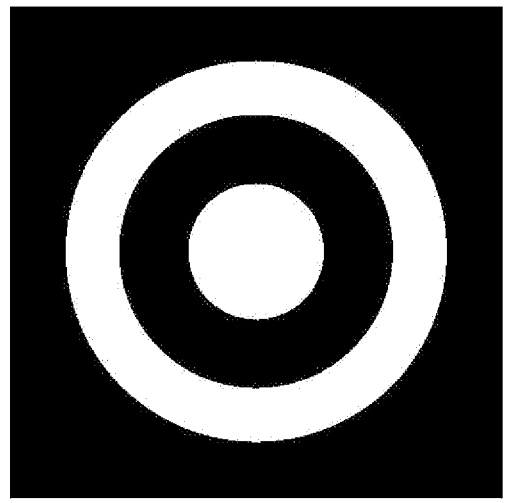
FIG. 10 illustrates the design of a mask in another embodiment in which each unit cell of the mask contains a circular ring feature and a circular filled feature.

In a further embodiment of the present invention, a periodic pattern of dots with properties suitable for a lithographic process may be obtained using a mask having a periodic pattern whose unit cell contains a circular ring feature and also a circular filled feature that is located inside the ring and is concentric with it, as is illustrated in FIG. 10. A variant of this embodiment combines this design with the multiple ring design of the fourth embodiment. Clearly the shapes of the ring features and filled features may, alternatively, be non-circular, such as square.

Figure 11:
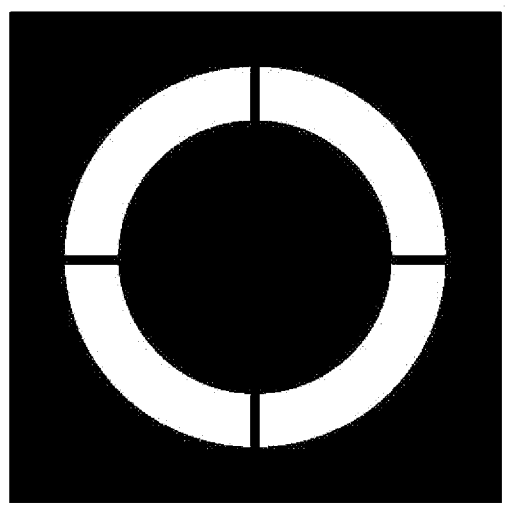
FIG. 11 illustrates the design of a mask in another embodiment in which each unit cell of the mask contains a ring feature composed of four segments.

In a yet further embodiment, the ring feature is not continuous around its extent but is instead divided into a number of segments, such as four, as is illustrated in FIG. 11. Other such variations and perturbations of a ring design may also be conceived and employed according to the teaching of the present invention.

In further embodiments, the medium between the mask and photoresist may be simply air or other liquids with higher refractive index to enable higher-resolution patterns to be printed.

While the embodiments described above may be considered as preferred embodiments of the invention, it should, of course, be understood that various modifications and changes in form or detail could readily be made without departing from the spirit of the invention. It is therefore intended that the invention should not be limited to the exact forms described and illustrated, but should be constructed to cover all modifications that may fall within the scope of the appended claims.

The invention claimed is:

1. A method of printing a desired periodic or quasi-periodic pattern of dot features into a photosensitive layer formed on a substrate, the method which comprises:
   a) designing a mask pattern with a periodic or quasi-periodic array of unit cells each having a ring feature;
   b) forming a mask with the mask pattern;
   c) arranging the mask with the mask pattern substantially parallel to the photosensitive layer; and
   d) adjusting a distance of the photosensitive layer from the mask and illuminating the mask according to a process selected from the group consisting of achromatic Talbot lithography and displacement Talbot lithography, to thereby cause an illumination being transmitted by the mask to expose the photosensitive layer to an integrated intensity distribution printing the desired pattern.

2. The method according to claim 1, wherein the step of designing the mask pattern comprises:
   defining the ring feature by a set of parameters;
   attributing a first set of values to the set of parameters;
   calculating a first integrated intensity distribution that would expose the photosensitive layer using a mask pattern defined by the first set of attributed values and one of the methods of achromatic Talbot lithography and displacement Talbot lithography, and evaluating said first integrated intensity distribution to obtain a first result for at least one figure of merit;
   repeating the attributing and calculating steps with at least one further set of values for the set of parameters and evaluating at least one further integrated intensity distribution to obtain at least one further result for the at least one figure of merit; and
   determining from the plurality of results thereby obtained the optimum set of attributed values for the set of parameters.

3. The method according to claim 1, wherein the ring feature is substantially circular.

4. The method according to claim 1, wherein the ring feature is substantially square.

5. The method according to claim 1, wherein the unit cell of the mask pattern further includes at least one additional ring feature that is concentric with the ring feature.

6. The method according to claim 1, wherein the unit cell of the mask pattern further includes a filled feature inside and concentric with the ring feature.

7. The method according to claim 2, wherein the steps of calculating the first and further integrated intensity distributions comprise employing an electromagnetic method.

8. The method according to claim 7, wherein the electromagnetic method is selected from the group consisting of finite difference time domain and rigorous coupled wave analysis.

9. The method according to claim 2, wherein the at least one figure of merit of the integrated intensity distribution is one of, or a combination of, magnitude of intensity peaks in the integrated intensity distributions that print the dot features, a full-width of the intensity peaks at half their maximum value, a contrast of the intensity peaks, a gradient of intensity at the edges of the peaks, a factor relating a period of the mask pattern to that of the printed pattern, and a cross-sectional shape of the intensity peaks.

10. The method according to claim 2, wherein the set of parameters comprises the inner and outer dimensions of the ring.

11. The method according to claim 1, wherein the ring features of the mask pattern are arranged on a grid selected from the group consisting of a square grid, a rectangular grid, or a hexagonal grid.

12. The method according to claim 1, wherein the features in the mask pattern comprise transparent regions in an otherwise opaque area.

13. The method according to claim 1, wherein the features in the mask pattern comprise opaque regions in an otherwise transparent area.

14. The method according to claim 1 wherein the features in the mask pattern have a phase shift with respect to a surrounding area.

15. The method according to claim 1 wherein the features in the mask are formed using partially opaque and phase shifting materials.

16. The method according to claim 1, wherein the quasi-periodic pattern of desired features has a variable period or a variable duty cycle.

17. The method according to claim 1, which comprises illuminating the mask with light having a given spectral bandwidth and adjusting the distance of the photosensitive layer from the mask to be larger than a certain value according to achromatic Talbot lithography, so that an intensity distribution exposing the photosensitive layer integrated over the spectral bandwidth of the illumination prints the desired pattern.

18. The method according to claim 1, which comprises illuminating the mask with substantially monochromatic light and adjusting the distance of the photosensitive layer from the mask to vary during the illumination according to displacement Talbot lithography, so that an intensity distribution exposing the photosensitive layer integrated over the variation of the distance prints the desired pattern.

19. The method according to claim 1, wherein the photosensitive layer is a positive-tone photoresist, and the method further comprises developing the photoresist so that an array of holes is formed in the photoresist.

20. The method according to claim 1, wherein the photosensitive layer is a negative-tone photoresist, and the method further comprises developing the photoresist so that an array of posts is formed in the photoresist.

21. The method according to claim 1, which further comprises placing a fluid with a given refractive index between the photosensitive layer and the mask.

* * * * *